United States Patent [19]

Atriss et al.

[11] Patent Number: 5,212,412
[45] Date of Patent: May 18, 1993

[54] POWER ON RESET CIRCUIT HAVING HYSTERESIS INVERTERS

[75] Inventors: Ahmad H. Atriss, Chandler; Benjamin C. Peterson, Tempe; Lanny L. Parker, Mesa, all of Ariz.

[73] Assignee: Codex Corporation, Mansfield, Mass.

[21] Appl. No.: 966,626

[22] Filed: Oct. 26, 1992

[51] Int. Cl.[5] .......................... H03K 3/29; H03K 3/01
[52] U.S. Cl. .................. 307/296.4; 307/290; 307/296.5; 307/272.3; 307/491; 307/264; 307/592; 307/594
[58] Field of Search ............... 307/290, 296.4–296.5, 307/272.3, 491, 264, 592, 594

[56] References Cited

U.S. PATENT DOCUMENTS 4,888,497 12/1989 Dallabora et al. .................. 307/290
4,888,498 12/1989 Kadakia .......................... 307/296.4

OTHER PUBLICATIONS

IBM Tech. Disc. Bul. vol. 32 No. 7 Dec. 1989 "Precision Power-On Reset Control Circuit" pp. 159–160.

Primary Examiner—Margaret R. Wambach
Attorney, Agent, or Firm—Robert D. Atkins

[57] ABSTRACT

A power on reset circuit uses a first inverter with hysteresis operating in response to a first power supply potential to develop a first reset signal when the first power supply potential is greater than a first predetermined threshold. A second inverter with hysteresis also operates in response to the first power supply potential for developing a second reset signal when the first power supply potential is greater than a second predetermined threshold. The first reset signal disables the second inverter until the first power supply potential reaches the first predetermined threshold. A delay circuit delays the second reset signal to ensure the first power supply potential is fully operational before indicating a ready condition.

20 Claims, 2 Drawing Sheets

POWER ON RESET CIRCUIT HAVING HYSTERESIS INVERTERS

BACKGROUND OF THE INVENTION

The present invention relates in general to power-on reset circuits and, more particularly, to a power-on reset circuit for monitoring a power supply potential and generating a ready signal when the power supply potential reaches a predetermined threshold.

Power-on reset circuits are commonly used in electronic circuit design to indicate when the power supply potential has reached an operational level for an integrated circuit (IC) following system power-up. A typical design approach involves counting a predetermined number of clock cycles after a system reset to allow sufficient time delay for the power supply potential to reach an operational level. The time delay approach can only estimate the slew rate of the power supply potential thus resulting in inefficiency if it allocates too much time for the power supply potential to reach steady-state. Also undesirable is the possibility that using a time delay may allow the IC to begin operating before the power supply potential reaches an adequate level of operation, i.e. not allowing enough time.

Another approach involves coupling the power supply conductor through a parallel resistor-capacitor (RC) combination external to the IC. When the power supply conductor charges the RC time constant to say 3.0 volts, an inverter internal to the IC changes state to indicate the power supply potential is ready for use. One problem with the RC time constant approach is the need for an IC pin to connect to the resistor and capacitor. Furthermore, since the inverter typically changes state before the power supply potential reaches optimum level, the initial behavior of the system is uncertain.

Hence, a need exists for a power-on reset circuit internal to the IC which directly monitors the power supply conductor and issues a ready signal when the power supply potential actually reaches an optimum operational level.

SUMMARY OF THE INVENTION

Briefly stated, the invention comprises a circuit including a first circuit responsive to a first power supply potential from a first power supply conductor for developing a first reset signal having a first logic state when the first power supply potential is less than a first predetermined threshold. The first reset signal has a second logic state when the first power supply potential is greater than a second predetermined threshold. A second circuit is responsive to the first power supply potential for developing a second reset signal having a first logic state when the first power supply potential is less than a third predetermined threshold. The second reset signal has a second logic state when the first power supply potential is greater than a fourth predetermined threshold. The second circuit receives the first reset signal to disable the second means until the first power supply potential reaches the second predetermined threshold.

DETAILED DESCRIPTION OF THE PREFERRED EMBODIMENT

Figure 1:
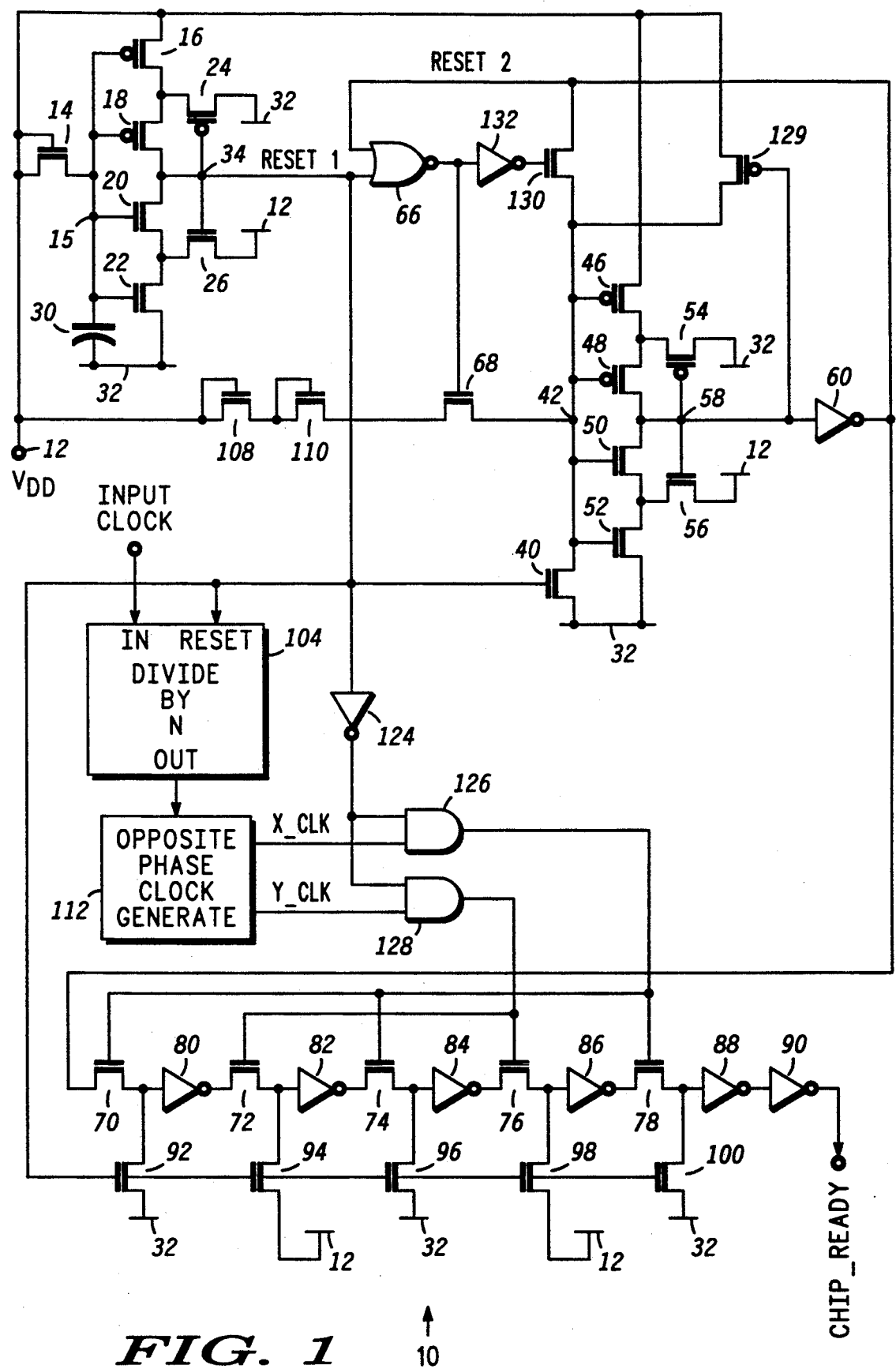
FIG. 1 is a schematic and block diagram illustrating a power-on reset circuit.

A power-on reset circuit 10 is shown in FIG. 1 suitable for manufacturing as an integrated circuit (IC) using conventional CMOS integrated circuit processes. Power-on reset circuit 10 monitors positive power supply conductor 12 and detects when the positive power supply voltage $V_{DD}$ reaches a proper operating level, say 4.5 volts. The positive power supply potential is typically received through an IC pin from an external source (not shown) and provides operating voltage for the IC during normal operation. When the system is first powered-up, power supply conductor 12 is substantially 0.0 volts albeit rapidly increasing. In the overall operation, the CHIP_READY signal remains at logic zero until the positive power supply conductor 12 exceeds 4.5 volts at which time CHIP_READY changes state to logic one indicating the positive power supply potential is ready for use.

Positive power supply conductor 12 is coupled to the gate and drain of transistor 14, while the source of transistor 14 is coupled to the gates of transistors 16, 18, 20 and 22 at node 15. The combination of transistors 16, 18, 20, 22, 24 and 26 function as an inverter with hysteresis; a first Schmitt trigger circuit. Capacitor 30 is coupled between node 15 and power supply conductor 32 operating at ground potential. Capacitor 30 slows the rate of increase in voltage at the gates of transistors 16–22. The source of transistor 16 is coupled to power supply conductor 12. Hence, the RESET1 signal at node 34 increases with $V_{DD}$ as transistors 16 and 18 turn on from the low input voltage less than the lower hysteresis threshold (1.4 volts) of the first Schmitt trigger. As the RESET1 signal at node 34 approaches a logic one level, transistor 26 turns on to raise the potential at the source of transistor 20 and establish the upper hysteresis threshold for the first Schmitt trigger at say 3.2 volts. Transistors 20 and 22 are non-conductive at this time.

The logic one RESET1 signal turns on transistor 40 and pulls node 42 to a logic zero from power supply conductor 32. Transistors 46, 48, 50, 52, 54 and 56 operate as an inverter with hysteresis, a second Schmitt trigger circuit, whereby the low level signal at node 42 less than the lower threshold (1.4 volts) turns on transistors 46 and 48 and pulls node 58 at the input of inverter 60 to logic one and a RESET2 signal at the output of inverter 60 to logic zero. Transistors 50 and 52 are non-conductive at this time. The logic zero at the output of inverter 60 in combination with the logic one RESET1 signal produces a logic zero at the output of NOR gate 66 and holds off transistor 68 to isolate node 42 from power supply conductor 12 while RESET1 is active.

The logic one RESET1 signal also initializes the delay circuit comprising transistors 70, 72, 74, 76 and 78, and inverters 80, 82, 84, 86, 88 and 90. A logic one at the gates of transistors 92, 94, 96, 98 and 100 produces logic zeroes at the inputs of inverters 80, 84 and 88 from power supply conductor 32, and logic ones at the inputs of inverters 82 and 86 from power supply conductor 12. The CHIP_READY signal remains at logic zero. The logic one RESET1 signal also resets divide-by-16 circuit 104.

Once the increasing positive power supply potential applied at conductor 12 increases to say 4.5 volts, node 15 reaches the upper hysteresis threshold of the first Schmitt trigger circuit 16-26 (3.2 volts). Transistors 20 and 22 conduct and pull the RESET1 signal to logic zero, turning off transistor 40 and releasing node 42. Transistors 92-100 no longer conduct. The logic zero at node 34 also turns on transistor 24 to set the lower hysteresis threshold of the first Schmitt trigger 16-26 at the drain of transistor 18 to 1.4 volts. The logic zero RESET1 signal and the logic zero RESET2 signal drive the output of NOR gate 66 to logic one and turn on transistor 68. The positive power supply potential $V_{DD}$ begins charging node 42 through transistors 108 and 110. However, while the potential at node 42 is still less than the upper hysteresis threshold of the second Schmitt trigger 46-56, transistors 46 and 48 are conducting and node 58 remains at logic one.

Figure 2:
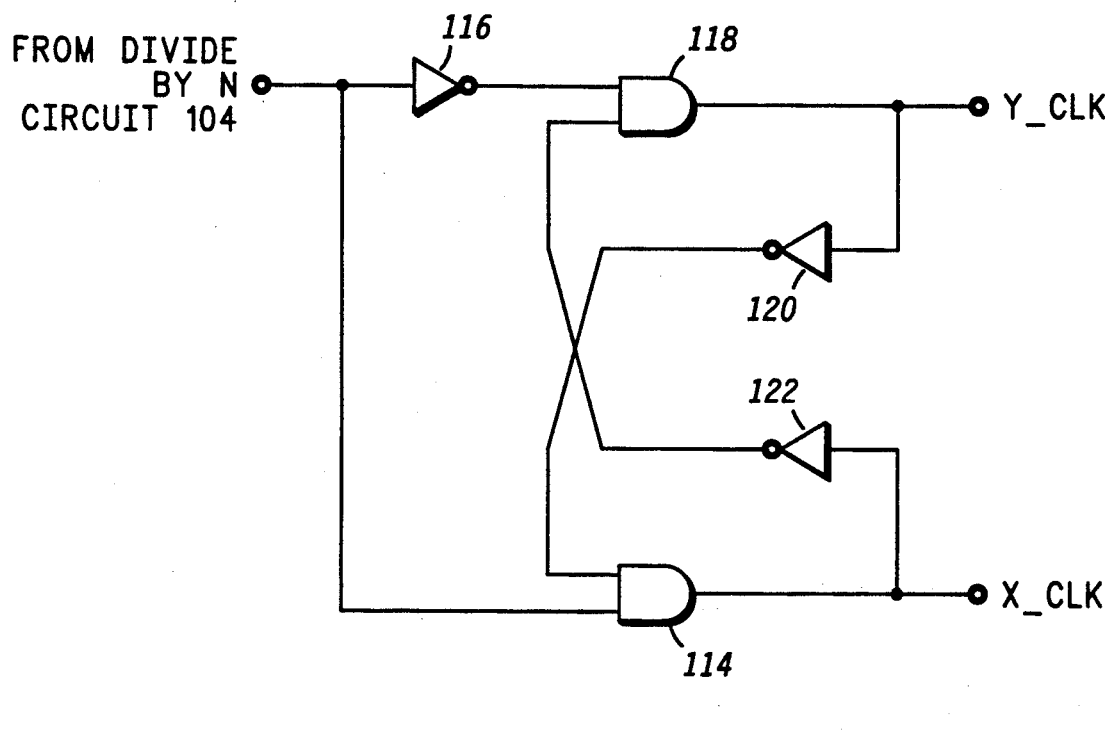
FIG. 2 is a schematic diagram illustrating the opposite phase clock generator of FIG. 1.

A 2.0 MHz input clock signal is divided down by divide-by-N circuit 104 to 125 KHz with N=16 after which opposite phase clock generator circuit 112 produces opposite phase clock signals X_CLK and Y_CLK. A divide-by-N circuit with a reset feature is well known in the art. An embodiment of opposite phase clock generator 112 is shown in FIG. 2 where the output signal of divide-by-N circuit 104 is applied to a first input of AND gate 114 and through inverter 116 to a first input of AND gate 118. The output of AND gate 118 provides the Y_CLK clock signal which is also applied through inverter 120 to a second input of AND gate 114. Likewise, the output of AND gate 114 provides the X_CLK clock signal as applied through inverter 122 to a second input of AND gate 118.

When the output signal from divide-by-N circuit 104 is logic zero, the X_CLK clock signal at the output of AND gate 114 goes to logic zero. AND gate 118 receives logic ones from the outputs of inverters 116 and 122 for providing a logic one Y_CLK clock signal. When the output signal from divide-by-N circuit 104 goes to logic one, the Y_CLK clock signal goes to logic zero. AND gate 114 output of inverter 120 for providing a logic one X_CLK clock signal. Hence, the X_CLK and Y_CLK clock signals are opposite phase operating at the frequency of the output signal from divide-by-N circuit 104.

Returning to FIG. 1, the RESET1 signal is complemented by inverter 124 and applied as a logic one at the first inputs of AND gates 126 and 128. The second inputs of AND gates 126 and 128 receive the X_CLK and Y_CLK signals, respectively. During the times that the X_CLK signal is logic one, transistors 70, 74 and 78 conduct to pass the logic state at the output of the previous inverter. During the times that the Y_CLK signal is logic one, transistors 72 and 76 conduct to pass the logic state at the output of the previous inverter. Thus, the logic zero state established at the output of inverter 60 following system power-up passes through transistors 70-78 and inverters 80-90 after three clock periods of the X_CLK and Y_CLK signals. The CHIP_READY signal remains at logic zero.

The upper and lower hysteresis thresholds of the first and second Schmitt triggers may be set alike, or another option is to have a lessor upper hysteresis threshold, say 2.4 volts, for the second Schmitt trigger. However, the first Schmitt trigger 16-26 changes to a low output state at a lower power supply potential $V_{DD}$ because there is only one gate-drain coupled transistor 14 separating conductor 12 and node 15. The second Schmitt trigger 46-56 requires a higher power supply potential $V_{DD}$ because there are two gate-drain coupled transistors 108-110 between conductor 12 and node 42. Hence, the first Schmitt trigger 16-26 may change to a logic zero output state with $V_{DD}$ at 4.5 volts, while the second Schmitt trigger needs $V_{DD}$ slightly greater, say 4.6 volts, to overcome the voltage drops across transistors 108-110 and switch to a low output state.

Once the voltage at power supply conductor 12 exceeds 4.5 volts and node 42 reaches the upper hysteresis threshold of the second Schmitt trigger 46-56, say 2.4 volts, transistors 50 and 52 conduct and pull node 58 to logic zero. The output of inverter 60 switches to logic one and produces a logic zero at the output of NOR gate 66 to turn off transistor 68. Transistor 129 pulls node 42 close to $V_{DD}$. In addition, transistor 130 conducts with a logic one at the output of inverter 132 and holds node 42 at a logic one from inverter 60. The logic zero at node 58 also turns on transistor 54 to set the lower hysteresis threshold (1.4 volts) of the second Schmitt trigger 46-56 at the drain of transistor 46. The logic one at the output of inverter 60 clocks through transistors 70-78 during three periods of the X_CLK and Y_CLK signals and switches the CHIP_READY signal to logic one indicating that power supply conductor 12 is operational. With node 42 latched at logic one, the output of inverter 60 remains at logic one for a continuous logic one CHIP_READY signal.

The delay through transistors 70-78 provides extra time for power supply conductor 12 to increase from 4.5 volts to substantially 5.0 volts. The delay may be increased or decreased as necessary for the particular application by adding or removing transistors like 70-78 and inverters like 80-90.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit, comprising:
   first means responsive to a first power supply potential from a first power supply conductor for developing a first reset signal having a first logic state when said first power supply potential is less than a first predetermined threshold, said first reset signal having a second logic state when said first power supply potential is greater than a second predetermined threshold; and
   second means responsive to said first power supply potential for developing a second reset signal having a first logic state when said first power supply potential is less than a third predetermined threshold, said second reset signal having a second logic state when said first power supply potential is greater than a fourth predetermined threshold, said second means receiving said first reset signal to disable said second means until said first power supply potential reaches said second predetermined threshold.

2. The circuit of claim 1 further including:
   third means operating in response to an input clock signal for generating first and second clock signals having opposite phase; and
   a delay circuit having an input coupled for receiving said second reset signal and having first and second control inputs for receiving said first and second clock signals respectively, said delay circuit providing a delayed second reset signal at an output following a predetermined number of cycles of said first and second clock signals.

3. The circuit of claim 2 wherein said second means includes:
- a first transistor having a gate, a drain and a source, said drain and gate receiving said first power supply potential;
- a second transistor having a gate, a drain and a source, said drain and gate being coupled together to said source of said first transistor;
- a third transistor having a gate, a drain and a source, said drain being coupled to said source of said second transistor;
- a first inverter circuit with hysteresis having an input coupled to said source of said third transistor at a first node and having an output at a second node;
- a second inverter having an input coupled to said second node and having an output for providing said second reset signal; and
- a NOR gate having first and second inputs and an output, said first input receiving said first reset signal, said second input receiving said second reset signal, said output being coupled to said gate of said third transistor.

4. The circuit of claim 3 wherein said second means further includes:
- a fourth transistor having a gate, a drain and a source, said drain being coupled to said first node, said gate receiving said first reset signal, said source being coupled to a second power supply conductor;
- a fifth transistor having a gate, a drain and a source, said source being coupled to said first power supply conductor, said gate being coupled to said second node, said drain being coupled to said first node;
- a third inverter having an input coupled to said output of said NOR gate and having an output; and
- a sixth transistor having a gate, a drain and a source, said source being coupled to said first node, said gate being coupled to said output of said third inverter, said drain being coupled to said output of said second inverter.

5. The circuit of claim 4 wherein said first inverter circuit includes:
- a seventh transistor having a gate, a drain and a source, said source being coupled to said first power supply conductor, said gate being coupled to said first node;
- an eighth transistor having a gate, a drain and a source, said source being coupled to said drain of said seventh transistor, said gate being coupled to said first node, said drain being coupled to said second node;
- a ninth transistor having a gate, a drain and a source, said source being coupled to said source of said eighth transistor, said gate being coupled to said second node, said drain being coupled to said second power supply conductor;
- a tenth transistor having a gate, a drain and a source, said source being coupled to said second power supply conductor, said gate being coupled to said first node;
- an eleventh transistor having a gate, a drain and a source, said source being coupled to said drain of said tenth transistor, said gate being coupled to said first node, said drain being coupled to said second node; and
- a twelfth transistor having a gate, a drain and a source, said source being coupled to said source of said tenth transistor, said gate being coupled to said second node, said drain being coupled to said first power supply conductor.

6. The circuit of claim 5 wherein said first means includes:
- a thirteenth transistor having a gate, a drain and a source, said drain and gate receiving said first power supply potential;
- a fourth inverter circuit with hysteresis having an input coupled to said source of said thirteenth transistor at a third node and having an output for providing said first reset signal at a fourth node; and
- a capacitor coupled between said third node and said second power supply conductor.

7. The circuit of claim 6 wherein said fourth inverter circuit includes:
- a fourteenth transistor having a gate, a drain and a source, said source being coupled to said first power supply conductor, said gate being coupled to said third node;
- a fifteenth transistor having a gate, a drain and a source, said source being coupled to said drain of said fourteenth transistor, said gate being coupled to said third node, said drain being coupled to said fourth node;
- a sixteenth transistor having a gate, a drain and a source, said source being coupled to said source of said fifteenth transistor, said gate being coupled to said fourth node, said drain being coupled to said second power supply conductor;
- a seventeenth transistor having a gate, a drain and a source, said source being coupled to said second power supply conductor, said gate being coupled to said third node;
- an eighteenth transistor having a gate, a drain and a source, said source being coupled to said drain of said seventeenth transistor, said gate being coupled to said third node, said drain being coupled to said fourth node; and
- a nineteenth transistor having a gate, a drain and a source, said source being coupled to said drain of said seventeenth transistor, said gate being coupled to said fourth node, said drain being coupled to said first power supply conductor.

8. The circuit of claim 7 wherein said third means includes:
- a divider circuit having a clock input, a reset input and an output, said clock input receiving said input clock signal, said reset input receiving said first reset signal; and
- an opposite phase clock generator circuit having an input coupled to said output of said divider circuit and having first and second output for providing said first and second clock signals having opposite phase.

9. The circuit of claim 8 wherein said third means further includes:
- a fifth inverter having an input for receiving said first reset signal and having output;
- a first AND gate having first and second inputs and an output, said first input being coupled to said output of said fifth inverter, said second input being coupled to said first output of said opposite phase clock generator, said output providing said first clock signal; and a second AND gate having first and second inputs and an output, said first input being coupled to said output of said fifth inverter, said second input being coupled to said second output of said opposite phase clock generator, said output providing said second clock signal.

10. The circuit of claim 9 wherein said delay circuit includes:
   a twentieth transistor having a gate, a drain and a source, said drain being coupled to said output of said second inverter, said gate receiving said first clock signal;
   a sixth inverter having an input coupled to said source of said twentieth transistor and having an output;
   a twenty-first transistor having a gate, a drain and a source, said drain being coupled to said input of said sixth inverter, said gate receiving said first reset signal, said source being coupled to said second power supply conductor;
   a twenty-second transistor having a gate, a drain and a source, said drain being coupled to said output of said sixth inverter, said gate receiving said second clock signal;
   a seventh inverter having an input coupled to said source of said twenty-second transistor and having an output for providing said delayed second reset signal; and
   a twenty-second transistor having a gate, a drain and a source, said drain being coupled to said input of said seventh inverter, said gate receiving said first reset signal, said source being coupled to said first power supply conductor.

11. A power-on reset circuit responsive to a first power supply potential from a first power supply conductor and having an output for providing a reset signal after said first power supply potential reaches a threshold, comprising:
   first means responsive to said first power supply potential for developing a first reset signal having a first logic state when said first power supply potential is less than a first predetermined threshold, said first reset signal having a second logic state when said first power supply potential is greater than a second predetermined threshold;
   a first transistor having a gate, a drain and a source, said drain and gate receiving said first power supply potential;
   a second transistor having a gate, a drain and a source, said drain and gate being coupled together to said source of said first transistor;
   a third transistor having a gate, a drain and a source, said drain being coupled to said source of said second transistor;
   a first inverter circuit with hysteresis having an input coupled to said source of said third transistor at a first node and having an output at a second node;
   a second inverter having an input coupled to said second node and having an output; and
   a NOR gate having first and second input and an output, said first input receiving said first reset signal, said second input receiving said second reset signal, said output being coupled to said gate of said third transistor.

12. The power-on reset circuit of claim 11 further including:
   second means operating in response to an input clock signal for generating first and second clock signals having opposite phase; and
   a delay circuit having an input coupled for receiving said second reset signal and having first and second control inputs for receiving said first and second clock signals, said delay circuit providing a delayed second reset signal at an output following a predetermined number of cycles of said first and second clock signals.

13. The power-on reset circuit of claim 12 further includes:
   a fourth transistor having a gate, a drain and a source, said drain being coupled to said first node, said gate receiving said first reset signal, said source being coupled to a second power supply conductor;
   a fifth transistor having a gate, a drain and a source, said source being coupled to said first power supply conductor, said gate being coupled to said second node, said drain being coupled to said first node;
   a third inverter having an input coupled to said output of said NOR gate and having an output; and
   a sixth transistor having a gate, a drain and a source, said source being coupled to said first node, said gate being coupled to said output of said third inverter, said drain being coupled to said output of said second inverter.

14. The power-on reset circuit of claim 13 wherein said first inverter circuit includes:
   a seventh transistor having a gate, a drain and a source, said source being coupled to said first power supply conductor, said gate being coupled to said first node;
   an eighth transistor having a gate, a drain and a source, said source being coupled to said drain of said seventh transistor, said gate being coupled to said first node, said drain being coupled to said second node;
   a ninth transistor having a gate, a drain and a source, said source being coupled to said source of said eighth transistor, said gate being coupled to said second node, said drain being coupled to said second power supply conductor;
   a tenth transistor having a gate, a drain and a source, said source being coupled to said second power supply conductor, said gate being coupled to said first node;
   an eleventh transistor having a gate, a drain and a source, said source being coupled to said drain of said tenth transistor, said gate being coupled to said first node, said drain being coupled to said second node; and
   a twelfth transistor having a gate, a drain and a source, said source being coupled to said source of said tenth transistor, said gate being coupled to said second node, said drain being coupled to said first power supply conductor.

15. The power-on reset circuit of claim 14 wherein said first means includes:
   a thirteenth transistor having a gate, a drain and a source, said drain and gate receiving said first power supply potential;
   a fourth inverter circuit with hysteresis having an input coupled to said source of said thirteenth transistor at a third node and having an output for providing said first reset signal at a fourth node; and
   a capacitor coupled between said third node and said second power supply conductor.

16. The power-on reset circuit of claim 15 wherein said fourth inverter circuit includes:
- a fourteenth transistor having a gate, a drain and a source, said source being coupled to said first power supply conductor, said gate being coupled to said third node;
- a fifteenth transistor having a gate, a drain and a source, said source being coupled to said drain of said fourteenth transistor, said gate being coupled to said third node, said drain being coupled to said fourth node;
- a sixteenth transistor having a gate, a drain and a source, said source being coupled to said source of said fifteenth transistor, said gate being coupled to said fourth node, said drain being coupled to said second power supply conductor;
- a seventeenth transistor having a gate, a drain and a source, said source being coupled to said second power supply conductor, said gate being coupled to said third node;
- an eighteenth transistor having a gate, a drain and a source, said source being coupled to said drain of said seventeenth transistor, said gate being coupled to said third node, said drain being coupled to said fourth node; and
- a nineteenth transistor having a gate, a drain and a source, said source being coupled to said drain of said seventeenth transistor, said gate being coupled to said fourth node, said drain being coupled to said first power supply conductor.

17. The power-on reset circuit of claim 16 wherein said second means includes:
- a divider circuit having a clock input, a reset input and an output, said clock input receiving said input clock signal, said reset input receiving said first reset signal; and
- an opposite phase clock generator circuit having an input coupled to said output of said divider circuit and having first and second output for providing said first and second clock signals having opposite phase.

18. The power-on reset circuit of claim 17 wherein said second means further includes:
- a fifth inverter having an input for receiving said first reset signal and having output;
- a first AND gate having first and second inputs and an output, said first input being coupled to said output of said fifth inverter, said second input being coupled to said first output of said opposite phase clock generator, said output providing said first clock signal; and
- a second AND gate having first and second inputs and an output, said first input being coupled to said output of said fifth inverter, said second input being coupled to said second output of said opposite phase clock generator, said output providing said second clock signal.

19. The power-on reset circuit of claim 18 wherein said delay circuit includes:
- a twentieth transistor having a gate, a drain and a source, said drain being coupled to said output of said second inverter, said gate receiving said first clock signal;
- a sixth inverter having an input coupled to said source of said twentieth transistor and having an output;
- a twenty-first transistor having a gate, a drain and a source, said drain being coupled to said input of said sixth inverter, said gate receiving said first reset signal, said source being coupled to said second power supply conductor;
- a twenty-second transistor having a gate, a drain and a source, said drain being coupled to said output of said sixth inverter, said gate receiving said second clock signal;
- a seventh inverter having an input coupled to said source of said twenty-second transistor and having an output for providing said delayed second reset signal; and
- a twenty-second transistor having a gate, a drain and a source, said drain being coupled to said input of said seventh inverter, said gate receiving said first reset signal, said source being coupled to said first power supply conductor.

20. A power on reset circuit, comprising:
- first means responsive to a first power supply potential for developing a first reset signal when said first power supply potential is greater than a first predetermined threshold;
- second means responsive to said first power supply potential for developing a second reset signal when said first power supply potential is greater than a second predetermined threshold, said second means receiving said first reset signal to disable said second means until said first power supply potential reaches said first predetermined threshold;
- third means operating in response to an input clock signal for generating first and second clock signals having opposite phase; and
- a delay circuit having an input coupled for receiving said second reset signal and having first and second control inputs for receiving said first and second clock signals, said delay circuit providing a delayed second reset signal at an output following a predetermined number of cycles of said first and second clock signals.

* * * * *